(12) United States Patent
Kawakubo et al.

(10) Patent No.: US 7,816,841 B2
(45) Date of Patent: Oct. 19, 2010

(54) PIEZOELECTRIC DRIVEN MEMS APPARATUS AND PORTABLE TERMINAL

(75) Inventors: Takashi Kawakubo, Yokohama (JP); Toshihiko Nagano, Kawasaki (JP); Michihiko Nishigaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 201 days.

(21) Appl. No.: 12/133,027

(22) Filed: Jun. 4, 2008

(65) Prior Publication Data
US 2009/0051251 A1 Feb. 26, 2009

(30) Foreign Application Priority Data
Aug. 24, 2007 (JP) ............... 2007-218642

(51) Int. Cl.
*H01L 41/08* (2006.01)
(52) U.S. Cl. ............... 310/330; 310/367; 310/368
(58) Field of Classification Search ............. 310/328, 310/330–332
See application file for complete search history.

(56) References Cited

U.S. PATENT DOCUMENTS

| | | | | |
|---|---|---|---|---|
| 3,646,413 | A * | 2/1972 | Oomen | 361/281 |
| 7,161,279 | B2 * | 1/2007 | Topliss et al. | 310/330 |
| 7,215,066 | B2 * | 5/2007 | Kawakubo et al. | 310/348 |
| 7,345,404 | B2 | 3/2008 | Klee et al. | |
| 2005/0194867 | A1 | 9/2005 | Kawakubo et al. | |
| 2005/0242687 | A1 | 11/2005 | Kawakubo et al. | |
| 2006/0055287 | A1 * | 3/2006 | Kawakubo et al. | 310/348 |
| 2006/0067840 | A1 | 3/2006 | Kawakubo et al. | |
| 2006/0285255 | A1 | 12/2006 | Kawakubo et al. | |
| 2007/0069342 | A1 | 3/2007 | Inaba | |
| 2007/0228887 | A1 * | 10/2007 | Nishigaki et al. | 310/332 |
| 2008/0042521 | A1 | 2/2008 | Kawakubo et al. | |
| 2008/0074006 | A1 | 3/2008 | Kawakubo et al. | |

FOREIGN PATENT DOCUMENTS

| | | |
|---|---|---|
| CN | 1750380 A | 3/2006 |
| CN | 1898814 A | 1/2007 |
| WO | 2005/064704 | 7/2005 |

OTHER PUBLICATIONS

Chinese Office Action for 2008102133229 mailed on Oct. 30, 2009.
Kawakubo, et al, RF-MEMS Tunable Capacitor with 3 V Operation Using Folded Beam Piezoelectric Bimorph Actuator, Journal of Microelectromechanical Systems, vol. 16, No. 6, Dec. 2006.
Chinese Office Action corresponding to U.S. Appl. No. 12/133,027 mailed on Mar. 11, 2010.

* cited by examiner

*Primary Examiner*—Mark Budd
(74) *Attorney, Agent, or Firm*—Turocy & Watson, LLP

(57) ABSTRACT

A piezoelectric driven MEMS apparatus includes: a substrate; a support part provided on the substrate; a fixed electrode provided on the substrate; and an actuator having a first electrode film, a piezoelectric film formed on the first electrode film, and a second electrode film formed on the piezoelectric film, a first end of the actuator being supported by the support part, a second end of the actuator being disposed so as to be opposed to the fixed electrode. The second end of the actuator is divided into a plurality of electrode parts by a plurality of slits which pass through the first electrode film, the piezoelectric film and the second electrode film, at least a part of each electrode part is linked to parts of adjacent electrode parts, and each electrode part is capable of generating bending deformation individually.

20 Claims, 12 Drawing Sheets

PIEZOELECTRIC DRIVEN MEMS APPARATUS AND PORTABLE TERMINAL

CROSS-REFERENCE TO RELATED APPLICATION

This application is based upon and claims the benefit of priority from prior Japanese Patent Application No. 2007-218642 filed on Aug. 24, 2007 in Japan, the entire contents of which are incorporated herein by reference.

BACKGROUND OF THE INVENTION

1. Field of the Invention

The present invention relates to a piezoelectric driven MEMS apparatus and a portable terminal having the MEMS apparatus.

2. Related Art

As variable capacitor elements, varicap diodes utilizing a depletion layer thickness change of a P/N junction are conventionally used. In the existing circumstances, however, the varicap diodes are restricted in use, because the capacitance change width which can be obtained is approximately five times at most and the Q value which represents smallness of the loss is as small as approximately 20 to 30.

On the other hand, variable capacitors fabricated by using the MEMS (Micro-electro-mechanical System) technique are drawing the attention recently. A movable electrode (action part) of a variable capacitor is formed on a beam supported in the air over a substrate, and a fixed electrode of the variable capacitor is formed on the substrate opposed to the beam. A variable capacitor is constituted by driving the beam with electrostatic force, thermal stress, electromagnetic force, or piezoelectric force and thereby changing a distance between the action part and the fixed electrode.

In especially a variable capacitor using piezoelectric counteraction as the drive force of the movable beam among the variable capacitors, the spacing between the action part and the fixed electrode can be changed continuously and largely. Therefore, the capacitance ratio can be made large. Furthermore, since air or gas is used as a dielectric, there are many advantages such as a very large Q value.

Furthermore, it is also possible to make the variable capacitor function as a capacitive type switch in a high frequency (RF) region by using the variable capacitor structure as it is and bringing the action part into contact with the fixed electrode via an extremely thin dielectric film. Such a switch formed by using the MEMS technique is also drawing attention because it has both a low resistance and a high insulative isolation property in the off-state as compared with a semiconductor switch.

However, the MEMS variable capacitor using the piezoelectric driven mechanism is supported in the air and has a long and thin beam structure including a piezoelectric layer sandwiched between upper and lower electrodes and a wide electrode structure. Therefore, the problem that the beam is warped upward or downward by slight residual stress in the material of the beam or the action part is serious. In order to cope with this problem, a piezoelectric driven MEMS apparatus having a folded structure is proposed by the present inventors (see. for example, JP-A 2006-87231 (KOKAI) and Kawakubo et al., "RF-MEMS Tunable Capacitor With 3V Operation Using Folded Beam Piezoelectric Bimorph Actuator," Journal of Microelectromechanical systems, Vol. 15, No. 6, December 2006, pp. 1759-1765). The piezoelectric driven MEMS apparatus having the folded structure includes a first beam having a first end fixed to a substrate, a second end serving as a connection end, and a piezoelectric film sandwiched between a pair of electrode films, a second beam having a first end serving as a connection end, a second end serving as an action part, and substantially the same structure and dimension as the first beam, and extending in a direction opposite to that of the first beam from the connection end, and a fixed electrode provided on the substrate so as to be opposed to the action part. In other words, two beams having the same structure and shape are disposed in parallel and ends of them are connected to form the folded structure. Even if the beams are warped due to residual strain at the time of film formation, therefore, the two beams are warped in the same way and it becomes possible to cancel the warps. Therefore, it is anticipated that the distance between the action end of the piezoelectric driven MEMS apparatus and the stationary end fixed to the substrate is kept substantially constant and stable operation becomes possible.

Even if the distance between the action end and the stationary end fixed to the substrate is kept substantially constant, however, the action part connected to a tip of the action end also warps in a paraboloidal form. As a result, an area of contact obtained when the action end comes in contact with a plane-shaped fixed electrode. In addition, even if the action end is pressed against the fixed electrode, the action end is hard to deform because of the paraboloidal shape, resulting in a problem of a small maximum capacitance value. This is one of greatest problems which hinder engineering application of the MEMS variable capacitors.

SUMMARY OF THE INVENTION

The present invention has been made in view of the above-described circumstances, and an object of the present invention is to provide a piezoelectric driven MEMS apparatus in which the contact area between the action part and the fixed electrode can be made as large as possible and a portable terminal having this piezoelectric driven MEMS apparatus.

A piezoelectric driven MEMS apparatus according to a first aspect of the present invention includes: a substrate; a support part provided on the substrate; a fixed electrode provided on the substrate; and an actuator having a first electrode film, a piezoelectric film formed on the first electrode film, and a second electrode film formed on the piezoelectric film, a first end of the actuator being supported by the support part, a second end of the actuator being disposed so as to be opposed to the fixed electrode, the second end of the actuator being divided into a plurality of electrode parts by a plurality of slits which pass through the first electrode film, the piezoelectric film and the second electrode film, at least a part of each electrode part being linked to parts of adjacent electrode parts, and each electrode part being capable of generating bending deformation individually.

A piezoelectric driven MEMS apparatus according to a second aspect of the present invention includes: a substrate; a first support part provided on the substrate; a second support part provided on the substrate; an actuator having a first electrode film, a piezoelectric film formed on the first electrode film, and a second electrode film formed on the piezoelectric film, a first end of the actuator being supported by the first support part, a second end of the actuator being supported by the second support part, a central part of the actuator being divided into a plurality of electrode parts by a plurality of slits which pass through the first electrode film, the piezoelectric film and the second electrode film, at least a part of each electrode part being linked to parts of adjacent electrode parts, and each electrode part being capable generating bending deformation individually; and a fixed electrode provided on the substrate so as to be opposed to the first electrode film in the central part.

A portable terminal according to a third aspect of the present invention includes: the piezoelectric driven MEMS apparatus according to the first aspect as at least one of a variable capacitor and an RF switch.

A portable terminal according to a fourth aspect of the present invention includes: the piezoelectric driven MEMS apparatus according to the second aspect as at least one of a variable capacitor and an RF switch.

DESCRIPTION OF THE EMBODIMENTS

Embodiments of the present invention will be described in detail with reference to the drawings.

First Embodiment

Figure 1:
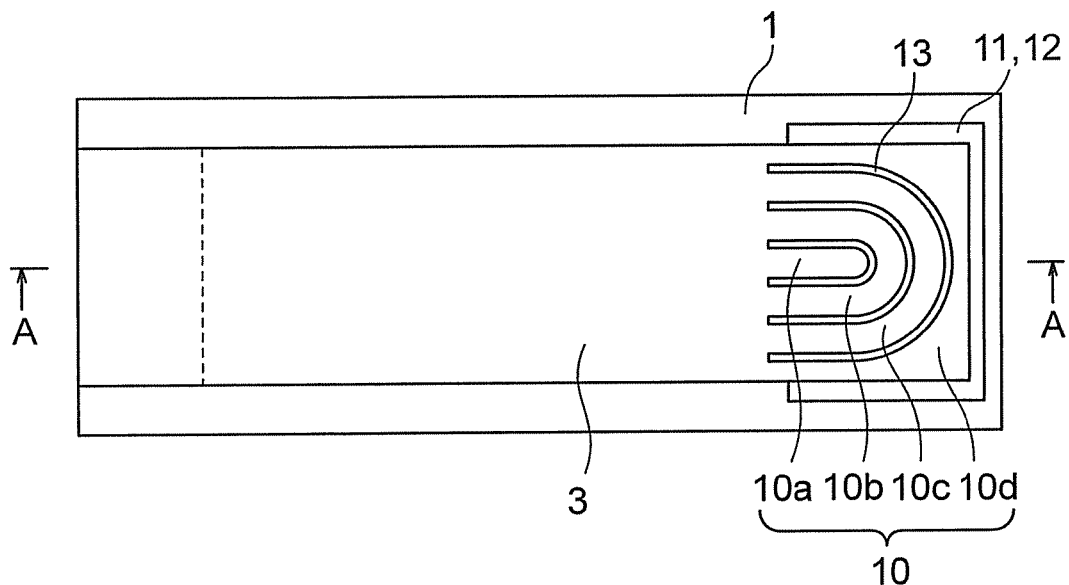
FIG. 1 is a plan view of a piezoelectric driven MEMS apparatus in a first embodiment.
Figure 2:
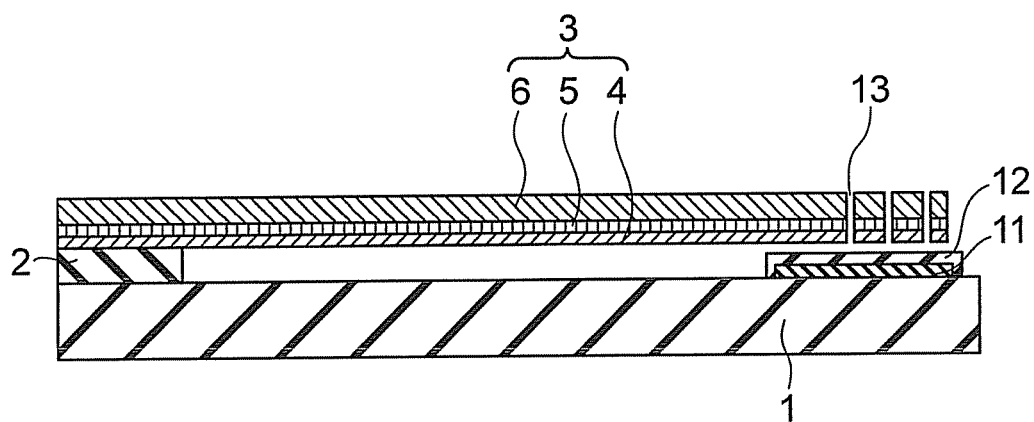
FIG. 2 is a sectional view in the first embodiment taken along a line A-A shown in FIG. 1.

A piezoelectric driven MEMS apparatus according to a first embodiment of the present invention is shown in FIGS. 1 and 2. FIG. 1 is a plan view of a piezoelectric driven MEMS apparatus according to the present embodiment. FIG. 2 is a sectional view taken along a line A-A shown in FIG. 1.

The piezoelectric driven MEMS apparatus according to the present embodiment is a variable capacitor, and includes an anchor (support part) 2 provided on a substrate 1, a movable beam (hereafter referred to as actuator as well) 3 fixed at its first end to the anchor 2, a fixed electrode 11 provided on the substrate 1 so as to be opposed to a second end of the movable beam 3, and a dielectric film 12 provided so as to cover the surface of the fixed electrode 11. The movable beam 3 has a stacked structure including a lower electrode 4, a piezoelectric film 5, and an upper electrode serving as a support film as well. The second end of the movable beam 3 located on the opposite side from the stationary end of the movable beam 3 fixed to the anchor 2 serves as an action part (movable electrode) 10 opposed to the fixed electrode 11. The action part 10 has three slits 13 each of which passes through the upper electrode 6 to the lower electrode 4 and has a combination of a semicircular slit and rectilinear slits. The action part 10 is divided into four electrode parts 10a to 10d by the slits. Since ends of the electrode parts 10a to 10d are connected via parts other than action ends, the electrode parts 10a to 10d can be regarded as singly-supported beams supported by parts of the movable beams 3 other than the action parts and it becomes possible to "generate bending deformation individually." Herein, "generate bending deformation individually" means that it becomes possible to bend and deform each electrode part even if other electrode parts cannot be deformed because they are restrained and it becomes possible to bring each electrode part into contact with an opposed fixed electrode via the dielectric film or directly (in the case where the dielectric film is not formed).

Figure 3:
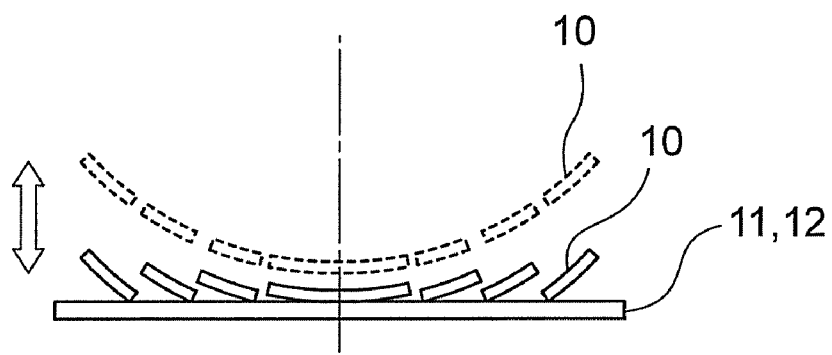
FIG. 3 is a sectional view for explaining operation of the MEMS apparatus in the first embodiment.
Figure 4:
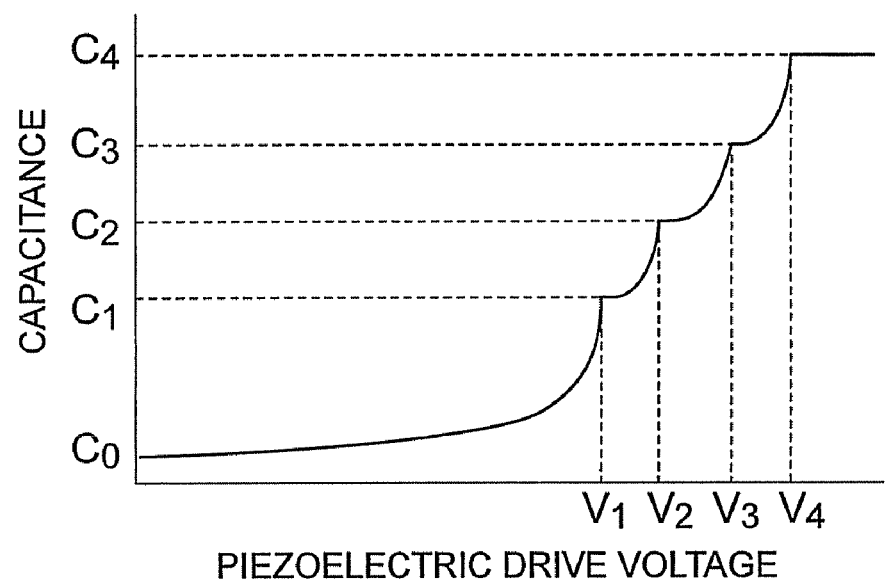
FIG. 4 is a characteristic diagram showing relations between a drive voltage and capacitance in the MEMS apparatus in the first embodiment.
Figure 5:
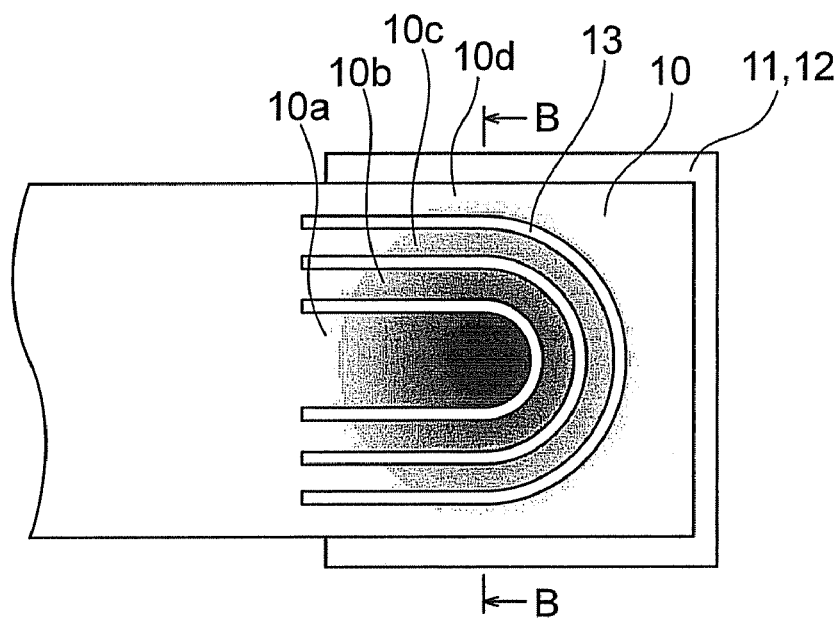
FIG. 5 is a plan view showing an action part in the MEMS apparatus in the first embodiment.

When a piezoelectric drive voltage is not applied between the lower electrode 4 and the upper electrode 6, i.e., when the action part 10 is held in the air in the piezoelectric driven MEMS apparatus according to the present embodiment having the above-described configuration, a section of the action part 10 in a direction perpendicular to a direction of extension of the movable beam 3 warps in a parabolic form as a whole so as to become convex as represented by dotted lines in FIG. 3. Since the first end of the movable beam 3 located on the opposite side from the action part 10 is fixed to the anchor 2, the bottom face of the lower electrode 4 becomes a constrained face whereas the top face of the upper electrode 6 becomes a free face. Therefore, the warp which becomes convex on the substrate side is caused by residual stress of the beam. A capacitance generated between the action part 10 and the fixed electrode 11 is denoted by $C_0$. When the piezoelectric drive voltage is applied between the lower electrode 4 and the upper electrode 6, the piezoelectric film 5 expands or contracts and the movable beam 3 bends upward or downward. Therefore, the capacitance generated between the action part 10 and the fixed electrode 11 increases from $C_0$ as shown in FIG. 4. If the piezoelectric drive voltage becomes $V_1$, the electrode part 10a located in the center of the action part comes in contact with the fixed electrode 11 via the dielectric film 12. The capacitance generated between the action part 10 and the fixed electrode 11 at this time becomes $C_1$ as shown in FIG. 4. If in this state the piezoelectric drive voltage is further raised to $V_2$, the electrode part 10b in the action part 10 also comes in contact with the fixed electrode 11 via the dielectric film 12. The capacitance generated between the action part 10 and the fixed electrode 11 at this time becomes $C_2$ as shown in FIG. 4. If in this state the piezoelectric drive voltage is further raised to $V_3$, the electrode part 10c in the action part 10 also comes in contact with the fixed electrode 11 via the dielectric film 12. The capacitance generated between the action part 10 and the fixed electrode 11 at this time becomes $C_3$ as shown in FIG. 4. If in this state the piezoelectric drive voltage is further raised to $V_4$, the electrode part 10d in the action part 10 also comes in contact with the fixed electrode 11 via the dielectric film 12. The section of the action part 10 in a direction perpendicular to a direction of extension of the movable beam 3 becomes as represented by solid lines in FIG. 3. The capacitance generated between the action part 10 and the fixed electrode 11 at this time becomes $C_4$ as shown in FIG. 4. The pressure applied to each electrode part in the action part 10 by the fixed electrode 11 is the greatest in the central electrode part 10a, and the pressure becomes smaller in the order of the electrode part 10b, the electrode part 10c and the electrode part 10d. This state is shown in FIG. 5. In FIG. 5, gradation is provided so as to become dense in proportion to the magnitude of the applied pressure. By the way, FIG. 3 shows a sectional view taken along a line B-B shown in FIG. 5.

Comparative Example

Figure 6:
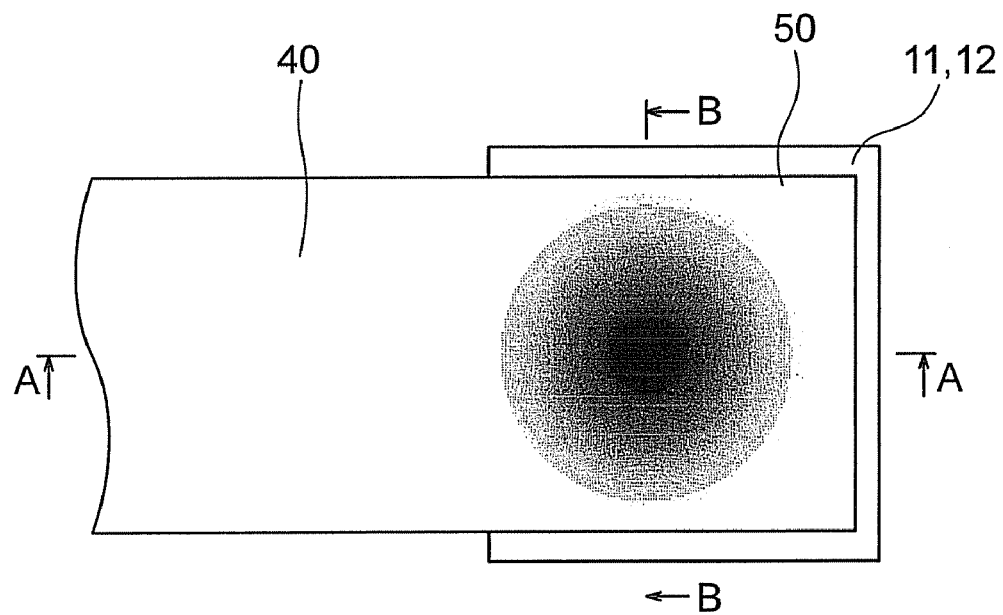
FIG. 6 is a plan view of a piezoelectric driven MEMS apparatus in a comparative example.
Figure 7:
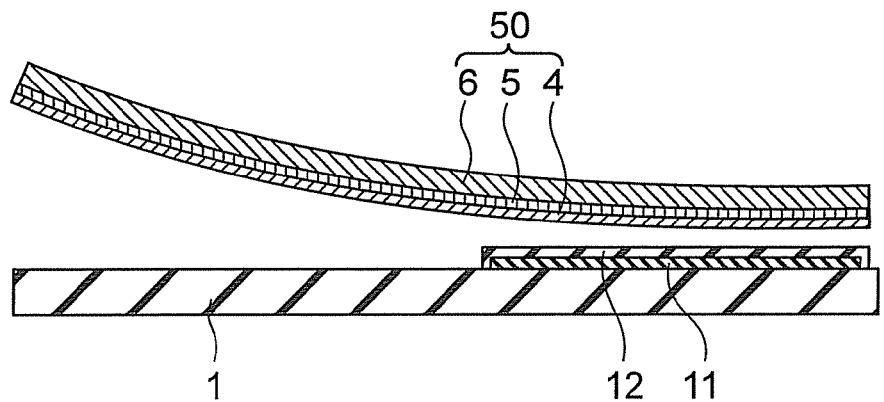
FIG. 7 is a sectional view in the comparative example taken along a line A-A shown in FIG. 6.

A piezoelectric driven MEMS apparatus according to a comparative example of the present embodiment is shown in FIG. 6 and FIG. 7. FIG. 6 is a plan view of the piezoelectric driven MEMS apparatus according to the comparative example. FIG. 7 is a sectional view taken along a A-A shown in FIG. 6.

Figure 8:
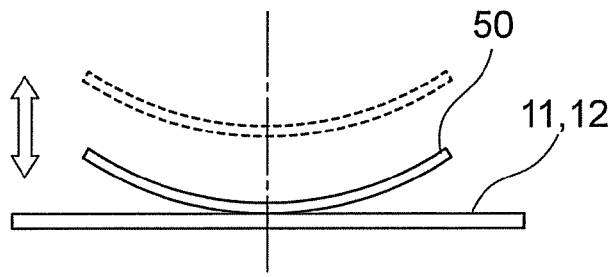
FIG. 8 is a sectional view for explaining operation in the comparative example.
Figure 9:
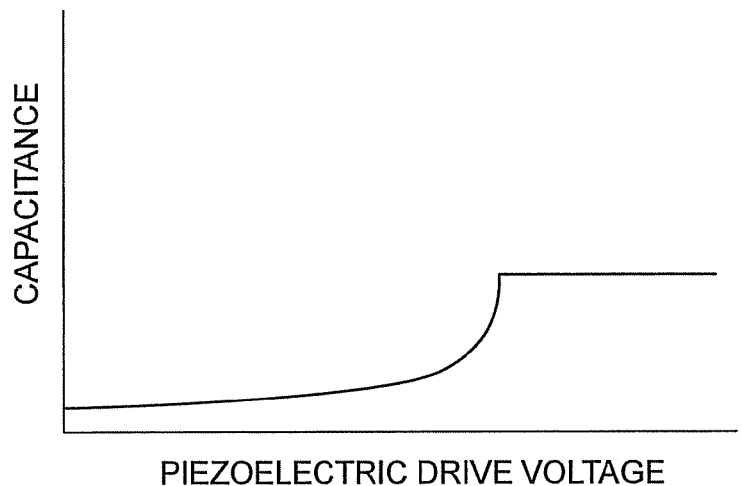
FIG. 9 is a characteristic diagram showing relations between a drive voltage and capacitance in the comparative example.

The MEMS apparatus according to the comparative example has a configuration obtained by replacing the action part 10 with an action part 50 having no slits 13. When a piezoelectric drive voltage is not applied between the lower electrode 4 and the upper electrode 6 in the MEMS apparatus according to the comparative example, an upward warp is generated in the action part 50 as represented by dotted lines in FIG. 8 in the same way as the first embodiment. When an action part 50 is pressed against the fixed electrode 11 via the dielectric film 12 by a movable beam 40, little deformation is generated because the paraboloidal warp in the action part 50 is the so-called shell structure and only the vicinity of the center of the action part 50 comes in contact with the fixed electrode 11 as represented by solid lines in FIG. 8. Therefore, dependence of the capacitance between the action part 50 and the fixed electrode 11 upon the piezoelectric drive voltage applied between the upper and lower electrodes of the action part 50 becomes as shown in FIG. 9.

In the comparative example, therefore, only a maximum capacitance of 185 fF can be obtained even if the action part and the fixed electrode are 100 μm square and an AlN film having a thickness of 20 nm and a relative dielectric constant of 10 is used as the dielectric film 12.

On the other hand, when the action part 10 is pressed against the fixed electrode 11 via the dielectric film 12 by the movable beam 3 in the first embodiment, first the electrode part 10a located in the center comes in contact with the fixed electrode 11 via the dielectric film 12 to generate deformation and the electrodes 10b, 10c and 10d come in contact with the fixed electrode via the dielectric film 12 in the cited order. As compared with the comparative example, therefore, it becomes possible for a far larger area in the action part 10 as a whole to come in contact with the fixed electrode 11 via the dielectric film 12. In the piezoelectric driven MEMS apparatus according to the present embodiment fabricated to have as a whole the same dimensions as those in the comparative example, a maximum capacitance of 320 fF can be obtained.

In the present embodiment, the action part 10 is divided into a plurality of electrode parts 10a, 10b, 10c and 10d by the slits 13 obtained by combining a plurality of sets of rectilinear slits formed in a direction of extension of the movable beam 3 and semicircular slits connected to rectilinear slits in respective sets, as heretofore described. Each of the electrode parts 10a, 10b, 10c and 10d can be deformed even if other electrode parts are constrained and cannot be deformed. Even if the movable beam 3 is warped by residual stress, therefore, it becomes possible for all of the electrode parts 10a, 10b, 10c and 10d to come in contact with the opposed electrode via the dielectric film 12 as the voltage applied between the lower electrode 4 and the upper electrode 6 is made large. In other words, in the present embodiment, it becomes possible for each of the electrode parts to "generate bending deformation individually." As a result, the contact area between the action part and the fixed electrode via the dielectric film 12 can be made as large as possible and the capacitance value can be made as large as possible.

(Manufacturing Method)

A manufacturing method for the piezoelectric driven MEMS apparatus according to the present embodiment will now be described with reference to FIGS. 10A to 10D.

Figure 10A:
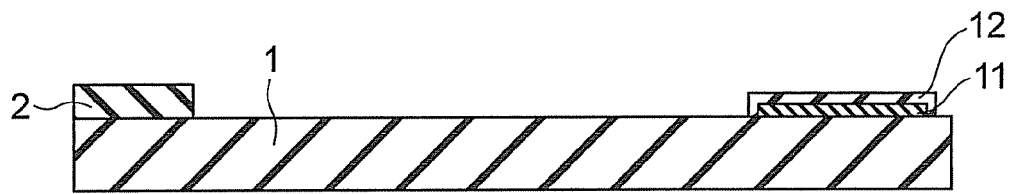
FIGS. 10A to 10D are sectional views showing a manufacturing method of the MEMS apparatus in the first embodiment.

First, the anchor 2 and the fixed electrode 11 covered by the dielectric film 12 are formed on the substrate 1 having an insulative surface are formed as shown in FIG. 10A. An insulation film such as a silicon nitride film or an oxide film is suitable as the material of the anchor 2 and the dielectric film 12. The anchor 2 and the dielectric film 12 can be formed by using known methods such as lithography and the reactive ion etching (RIE).

Figure 10B:
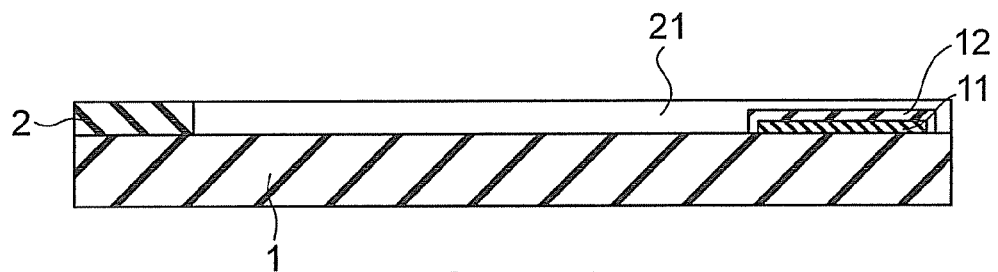

Subsequently, a sacrifice layer 21 is formed on the substrate 1 so as to cover the anchor 2 and the fixed electrode 11 and the surface of the sacrifice layer 21 is polished and planarized until the anchor 2 is exposed by using the well-known CMP technique as shown in FIG. 10B. As for the sacrifice layer 21, it is possible to use an inorganic material, a metal material or an organic material which can be selectively etched with respect to other film materials. In the present embodiment, however, polycrystal silicon is used.

Figure 10C:
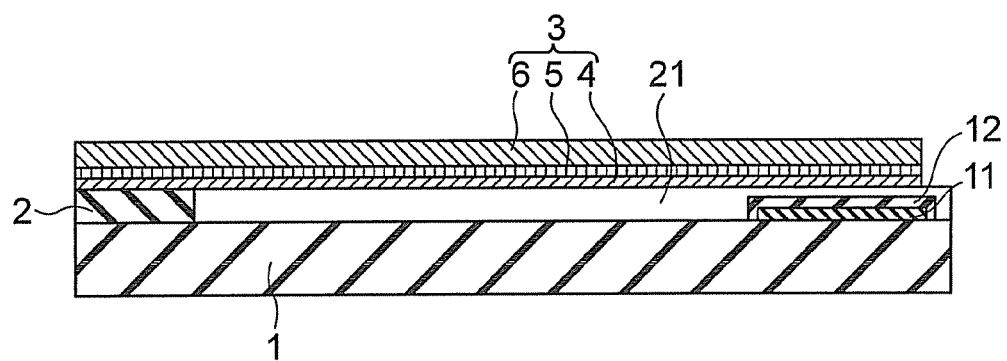

Subsequently, the lower electrode 4, the piezoelectric film 5 and the upper electrode 6 of the movable beam are formed in the cited order over the anchor 2 and the sacrifice layer 21 as shown in FIG. 10C. Al having a thickness of 200 nm is used as the lower electrode 4. AlN which is c-axis oriented having a film thickness of 500 nm is used as the piezoelectric film 5. Al having a film thickness of 600 nm is used as the upper electrode 6. Al and AlN are fabricated by sputtering and patterned by lithography and etching.

Figure 10D:
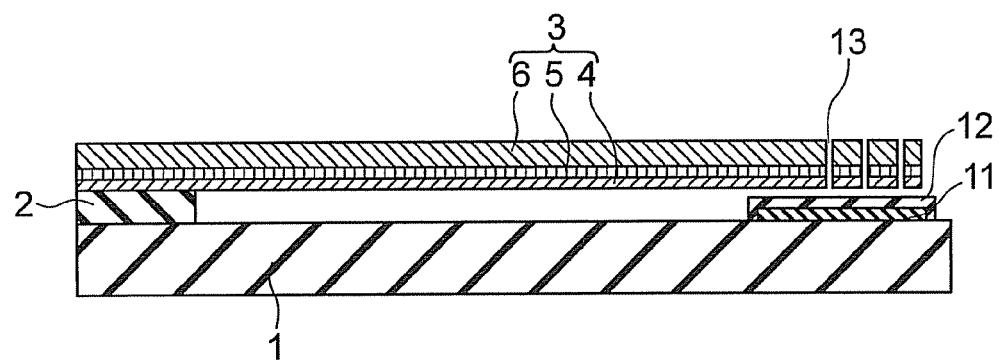

Subsequently, a part of the movable beam is patterned collectively by using lithography and RIE to form electrode part dividing slits 13 as shown in FIG. 10D. Thereafter, the sacrifice layer 21 is removed to form the movable beam 3 by selective etching using $XeF_2$ as etching gas.

In this way, the piezoelectric driven MEMS apparatus having the action part divided into electrode parts can be produced.

Second Embodiment

Figure 11:
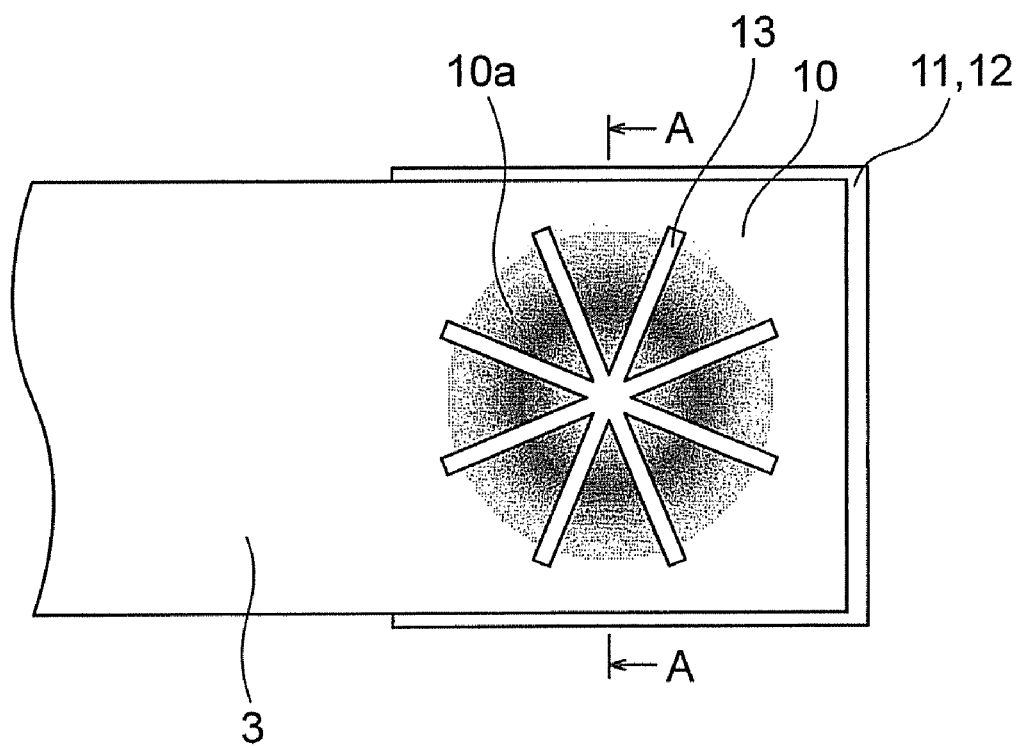
FIG. 11 is a plan view showing an action part in the MEMS apparatus in a second embodiment.

A plan view of an action part of a piezoelectric driven MEMS apparatus according to a second embodiment of the present invention is shown in FIG. 11. The piezoelectric driven MEMS apparatus according to the present embodiment has a configuration obtained from that of the first embodiment by changing the shape of the slits 13 in the action part 10. The slits 13 are formed so as to extend radially from substantially the center, and the action part 10 is divided into eight triangular electrode parts 10a by the slits 13. A perimeter part of each electrode part 10a is connected to perimeter parts of adjacent electrode parts. Therefore, each electrode part 10a can be regarded as a singly-supported beam supported at its perimeter part and it becomes possible to "generate bending deformation individually."

Figure 12:
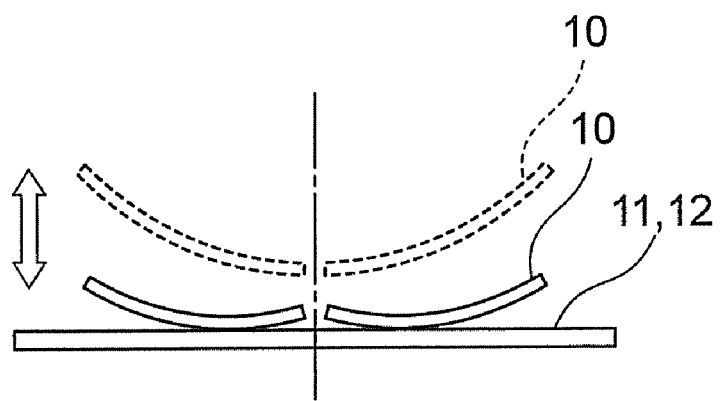
FIG. 12 is a sectional view for explaining operation in the second embodiment.

In the present embodiment, a parabolic warp is generated as a whole when the action part 10 is held in the air (as represented by dotted lines) as shown in FIG. 12. On the other hand, if the action part 10 is pressed against the fixed electrode 11 by the movable beam 3, then each electrode part 10a comes in contact with the fixed electrode 11 via the dielectric film 12, resulting in deformation and contact in a wide area. As a result, it becomes possible for the action part 10 as a whole to come in contact with the fixed electrode 11 via the dielectric film 12 in a far larger area as represented by solid lines in FIG. 12. FIG. 12 is a sectional view taken along a line A-A shown in FIG. 11. FIG. 11 shows pressure applied from the fixed electrode 11 when the action part 10 is in contact with the fixed electrode 11. In FIG. 11, gradation is provided so as to become dense in proportion to the magnitude of the applied pressure.

If the dimensions as a whole are made the same as those in the comparative example described in the first embodiment excepting the slits 13, a maximum capacitance of 285 fF can be obtained in the present embodiment. By the way, only a maximum capacitance of 185 fF can be obtained in the comparative example.

In the present embodiment, the action part 10 is divided into a plurality of triangular electrode parts 10a by the slits 13 formed so as to extend radially from substantially the center of the action part 10, as heretofore described. It becomes possible for each electrode part 10a to "generate bending deformation individually." As a result, the contact area between the action part and the fixed electrode via the dielectric film 12 can be made as large as possible and the capacitance value can be made as large as possible.

Third Embodiment

Figure 13:
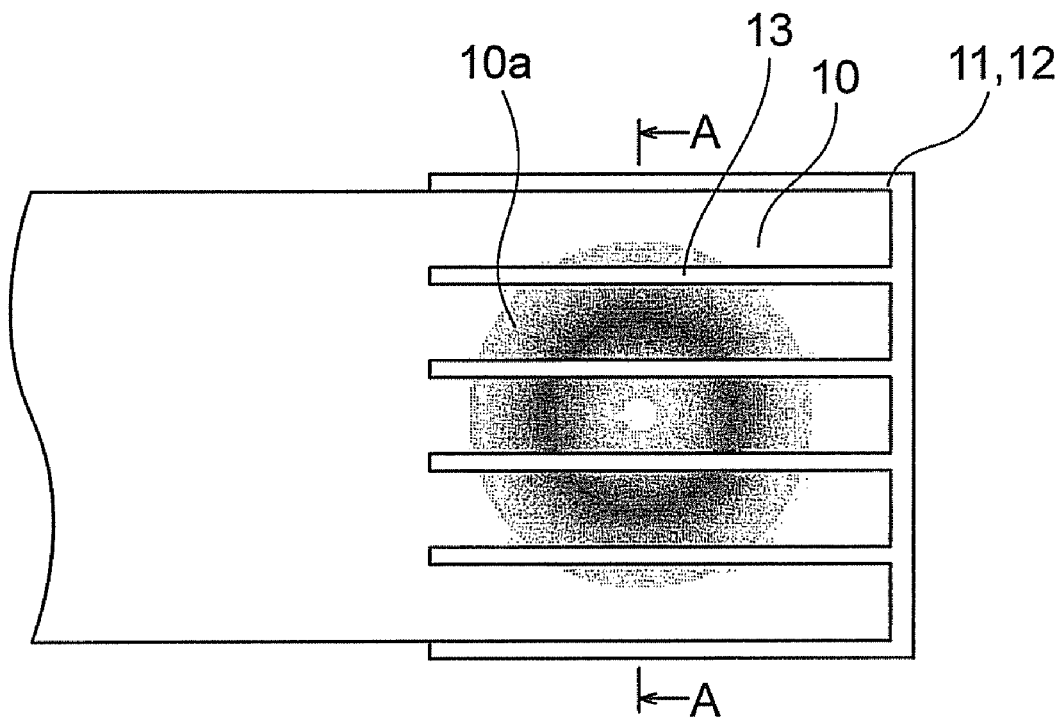
FIG. 13 is a plan view showing an action part in the MEMS apparatus in a third embodiment.

A plan view of an action part of a piezoelectric driven MEMS apparatus according to a third embodiment of the present invention is shown in FIG. 13. The piezoelectric driven MEMS apparatus according to the present embodiment has a configuration obtained from that of the first embodiment by changing the shape of the slits 13 in the action part 10. Four rectilinear slits 13 are provided in a direction in which the movable beam 3 extends toward the end of the action part 10. The action part 10 is divided into five rectangular electrode parts 10a by the slits 13. Each electrode part 10a can be regarded as a singly-supported beam supported at its end by the movable beam 3 and it becomes possible to "generate bending deformation individually."

Figure 14:
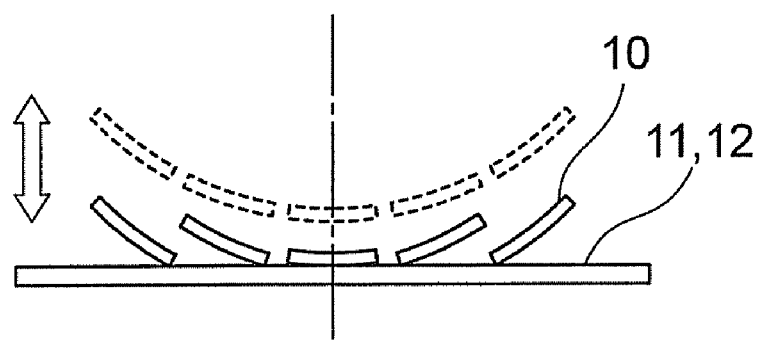
FIG. 14 is a sectional view for explaining operation in the third embodiment.

In the present embodiment, a parabolic warp is generated as a whole when the action part 10 is held in the air (as represented by dotted lines) as shown in FIG. 14. On the other hand, if the action part 10 is pressed against the fixed electrode 11 via the dielectric film 12 by the movable beam 3, then each electrode part 10a comes in contact with the fixed electrode 11 via the dielectric film 12, resulting in deformation and contact in a wide area. As a result, it becomes possible for the action part 10 as a whole to come in contact with the fixed electrode 11 via the dielectric film 12 in a far larger area as represented by solid lines in FIG. 14. FIG. 14 is a sectional view obtained by cutting along a cut line A-A shown in FIG. 13. FIG. 13 shows pressure applied from the fixed electrode 11 when the action part 10 is in contact with the fixed electrode 11 via the dielectric film 12. In FIG. 13, gradation is provided so as to become dense in proportion to the magnitude of the applied pressure.

If the dimensions as a whole are made the same as those in the comparative example described in the first embodiment excepting the slits 13, a maximum capacitance of 310 fF can be obtained in the present embodiment. By the way, only a maximum capacitance of 185 fF can be obtained in the comparative example.

In the present embodiment, the action part 10 is divided into a plurality of rectangular electrode parts 10a by the slits 13 formed rectilinearly in the direction in which the movable beam 3 extends toward ends of the action part 10, as heretofore described. It becomes possible for each electrode part 10a to "generate bending deformation individually." As a result, the contact area between the action part and the fixed electrode via the dielectric film 12 can be made as large as possible and the capacitance value can be made as large as possible.

Fourth Embodiment

Figure 15:
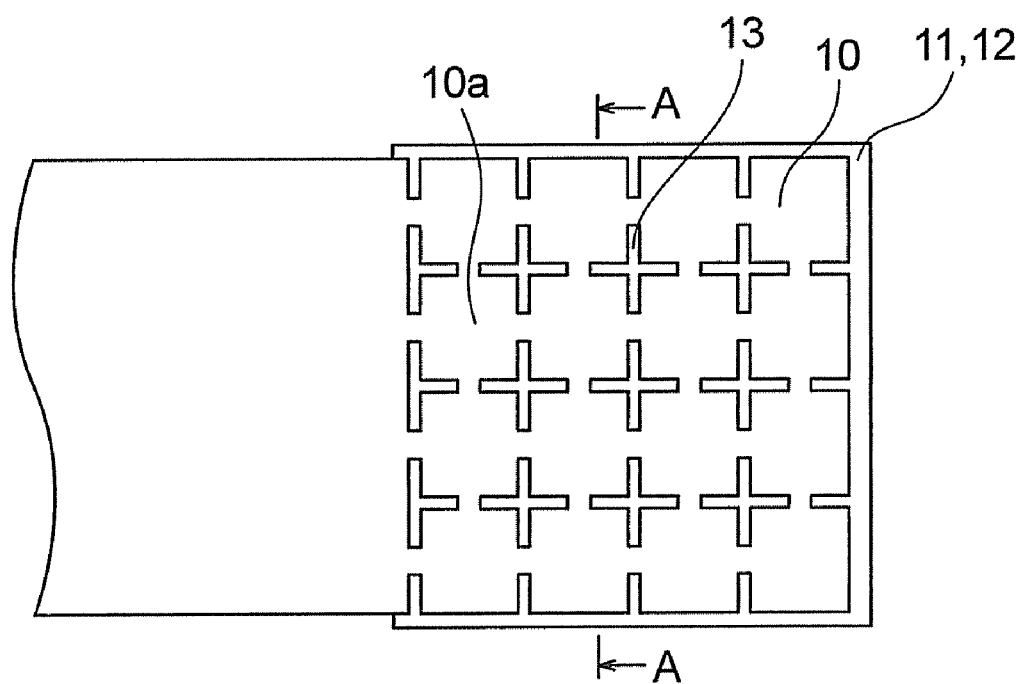
FIG. 15 is a plan view showing an action part in the MEMS apparatus in a fourth embodiment.

A plan view of an action part of a piezoelectric driven MEMS apparatus according to a fourth embodiment of the present invention is shown in FIG. 15. The piezoelectric driven MEMS apparatus according to the present embodiment has a configuration obtained from that of the first embodiment by changing the shape of the slits 13 in the action part 10. The slits 13 are provided in a seam form so as to be plural in each of the lateral direction and longitudinal direction of the action part 10. In other words, each of the slits 13 is cross-shaped in a central part of the action part 10, and it is I-shaped or T-shaped in a peripheral part of the action part 10. The action part 10 is divided into eight rectangular electrode parts 10a by the slits 13. Only at least a part of a perimeter of each electrode part 10a is connected to adjacent electrode parts. A ratio occupied by connection parts in the perimeter length of each electrode part is 25% at maximum. Therefore, it becomes possible for each electrode part to "generate bending deformation individually" around the connection part.

Figure 16:
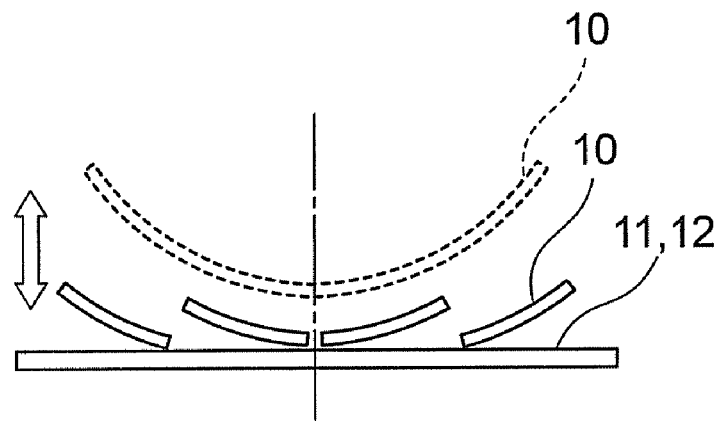
FIG. 16 is a sectional view for explaining operation in the fourth embodiment.

When the action part 10 is held in the air (as represented by dotted lines), a parabolic warp is generated as a whole as shown in FIG. 16. On the other hand, if the action part 10 is pressed against the fixed electrode 11 via the dielectric film by the movable beam 3, then each electrode part 10a comes in contact with the fixed electrode 11 via the dielectric film 12, resulting in deformation and contact in a wide area. As a result, it becomes possible for the action part 10 as a whole to come in contact with the fixed electrode 11 via the dielectric film 12 in a far larger area as represented by solid lines in FIG. 16. FIG. 16 is a sectional view taken along a line A-A shown in FIG. 15.

If the dimensions as a whole are made the same as those in the comparative example described in the first embodiment excepting the slits 13, a maximum capacitance of 310 fF can be obtained in the present embodiment. By the way, only a maximum capacitance of 185 fF can be obtained in the comparative example.

In the present embodiment, the action part 10 is divided into a plurality of rectangular electrode parts 10a by the cross-shaped, I-shaped and T-shaped slits 13. It becomes possible for each electrode part 10a to "generate bending deformation individually." As a result, the contact area between the action part and the fixed electrode via the dielectric film 12 can be made as large as possible and the capacitance value can be made as large as possible.

(First Modification)

Figure 17:
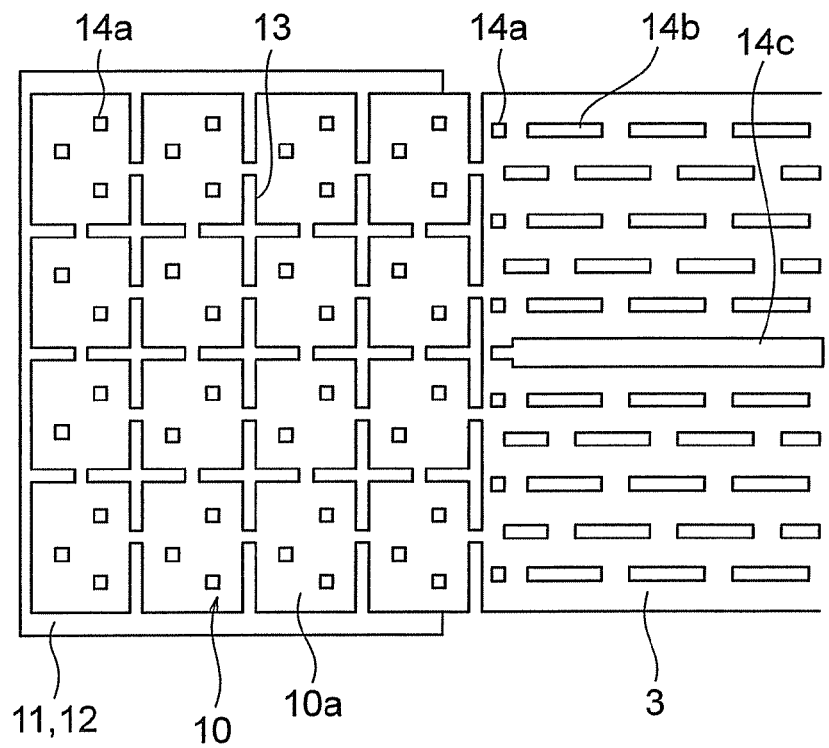
FIG. 17 is a plan view showing an action part in the MEMS apparatus in a first modification of the fourth embodiment.

A plan view of an action part of a piezoelectric driven MEMS apparatus according to a first modification of the present embodiment is shown in FIG. 17. The piezoelectric driven MEMS apparatus according to the present modification has a configuration obtained from that of the fourth embodiment by providing at least one hole 14a passing through the upper electrode and the lower electrode in each electrode part 10a. Furthermore, a plurality of holes 14a are also provided through the movable beam 3 which supports the action part 10. In addition, a plurality of short and thin slits 14b are provided through the movable beam 3 in the direction of its extension, and a thick and long slit 14c is provided in the center of the movable beam 3 in the direction of its extension. When fabricating the MEMS apparatus, the holes 14a and the slits 14b and 14c can be used as drawing holes for removing the sacrifice layer.

Figure 18:
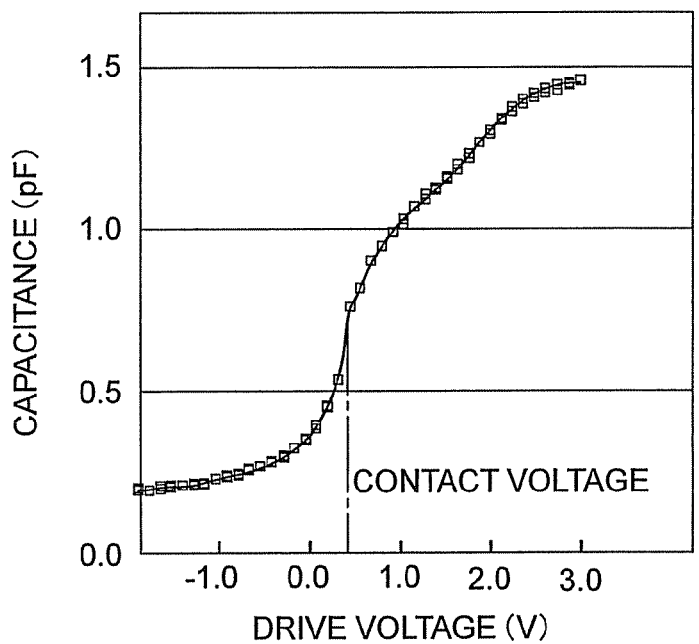
FIG. 18 is a characteristic diagram showing relations between a drive voltage and capacitance in the first modification.

FIG. 18 shows the capacitance measured as the piezoelectric drive voltage of the MEMS apparatus (variable capacitor) in the present modification is changed. Even after the action part 10 comes in contact with the fixed electrode 11 via the dielectric film 12, the contact area increases and consequently the capacitance also increases.

In the present modification as well, the contact area between the action part and the fixed electrode via the dielectric film 12 can be made as large as possible and the capacitance value can be made as large as possible, in the same way as the fourth embodiment.

(Second Modification)

Figure 19:
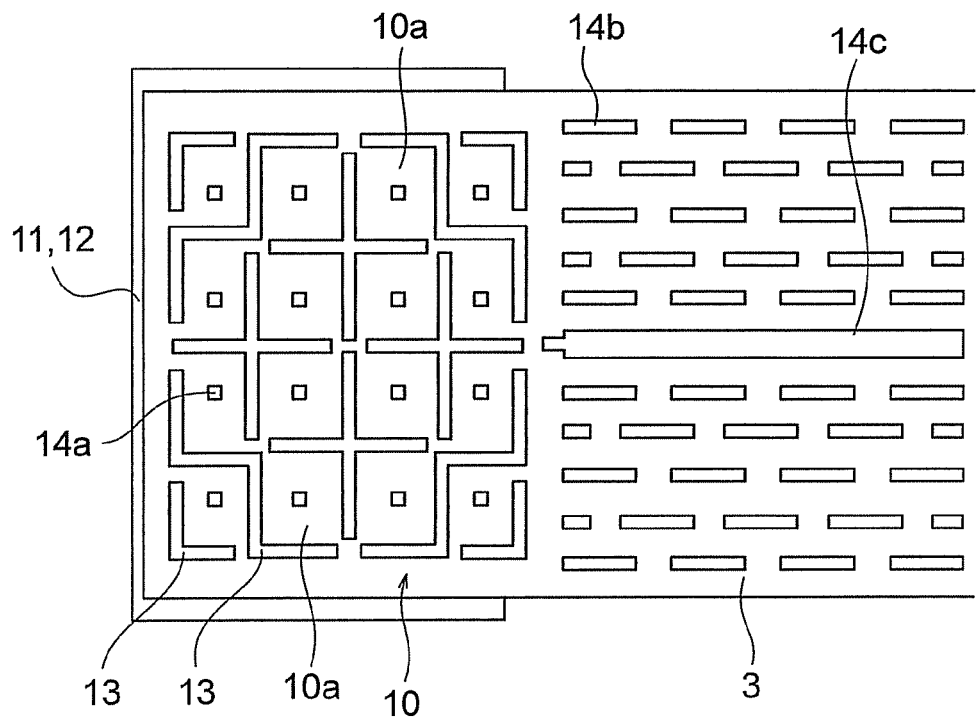
FIG. 19 is a plan view showing an action part in the MEMS apparatus in a second modification of the fourth embodiment.

A plan view of an action part of a piezoelectric driven MEMS apparatus according to a second modification of the present embodiment is shown in FIG. 19. In the piezoelectric driven MEMS apparatus according to the present modification, a region of the action part 10 except a peripheral region is divided into sixteen electrode parts 10a by slits 13. Only at least a part of a perimeter of each electrode part 10a is connected to adjacent electrode parts. A ratio occupied by connection parts in the perimeter length of each electrode part is 25% at maximum. Therefore, it becomes possible for each electrode part to "generate bending deformation individually" around the connection part.

Furthermore, at least one hole 14a passing through the upper electrode and the lower electrode is provided in each electrode part 10a. Furthermore, a plurality of holes 14a are also provided through the movable beam 3 which supports the action part 10. In addition, a plurality of short and thin slits 14b are provided through the movable beam 3 in the direction of its extension, and a thick and long slit 14c is provided in the center of the movable beam 3 in the direction of its extension. When fabricating the MEMS apparatus, the holes 14a and the slits 14b and 14c can be used as drawing holes for removing the sacrifice layer.

In the present modification as well, the contact area between the action part and the fixed electrode via the dielectric film 12 can be made as large as possible and the capacitance value can be made as large as possible, in the same way as the fourth embodiment.

Fifth Embodiment

Figure 20:
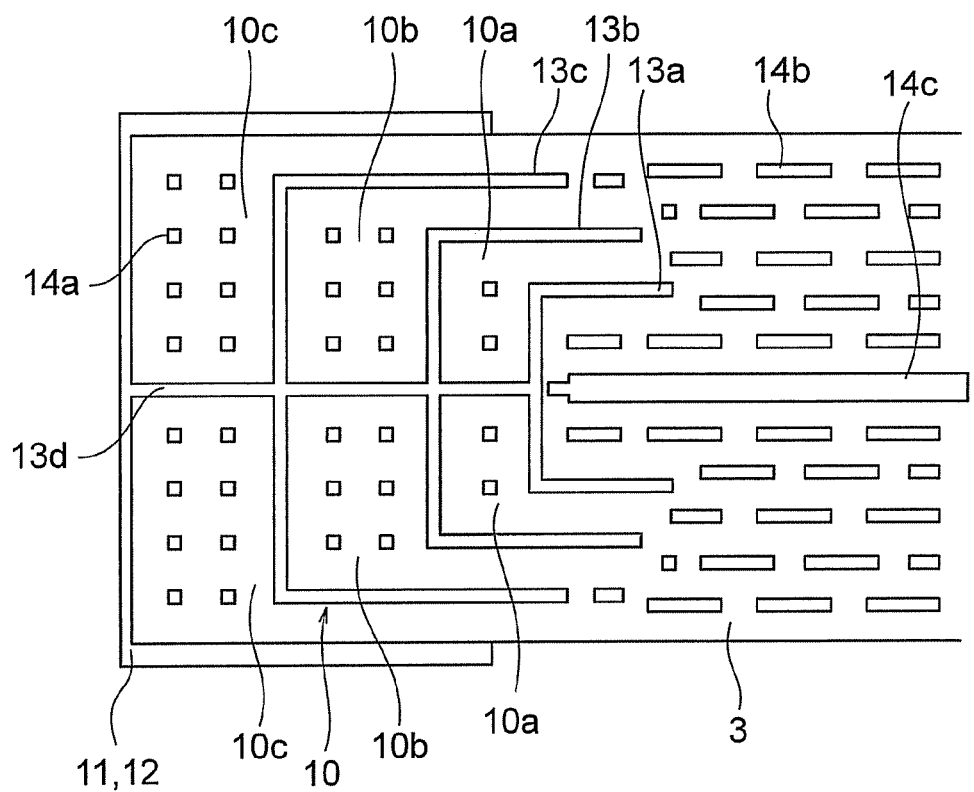
FIG. 20 is a plan view showing an action part in the MEMS apparatus in a fifth embodiment.

A plan view of an action part of a piezoelectric driven MEMS apparatus according to a fifth embodiment of the present invention is shown in FIG. 20. In the piezoelectric driven MEMS apparatus according to the present embodiment, the action part 10 is divided into a pair of small electrode parts 10a, a pair of middle electrode parts 10b and a pair of large electrode parts 10c by three C-shaped slits 13a, 13b and 13c. The large electrode parts 10c, the middle electrode parts 10b and the small electrode parts 10c are formed in the cited order from the end side of the action part 10. The large electrode parts 10c and the middle electrode parts 10b are separated from each other by the slit 13c. The middle electrode parts 10b and the small electrode parts 10a are separated from each other by the slit 13b. The pair of small electrode parts 10a, the pair of middle electrode parts 10b and the pair of large electrode parts 10c are divided into the small electrode parts 10a, the middle electrode parts 10b and the large electrode parts 10c by a slit 13d provided in the center of the action part 10 in a direction of extension of the action part 10. The slit 13c is disposed so as to surround three sides of the pair of the middle electrode parts 10b, and the slit 13b is disposed so as to surround three sides of the pair of the small electrode parts 10a. The slit 13a is disposed on the remaining one side of the pair of the small electrode parts 10a. Only at least a part of a perimeter of each of the electrode parts 10a, 10b and 10c is connected to adjacent electrode parts via a connection part. A ratio occupied by the connection part in the perimeter length of each electrode part is 25% at maximum. Therefore, it becomes possible for each electrode part to "generate bending deformation individually."

Furthermore, at least one hole 14a passing through the upper electrode and the lower electrode is provided in each of the electrode parts 10a, 10b and 10c.

Furthermore, a plurality of holes 14a are also provided through the movable beam 3 which supports the action part 10. In addition, a plurality of short and thin slits 14b are provided through the movable beam 3 in the direction of its extension, and a thick and long slit 14c is provided in the center of the movable beam 3 in the direction of its extension. When fabricating the MEMS apparatus, the holes 14a and the slits 14b and 14c can be used as drawing holes for removing the sacrifice layer.

In the present embodiment as well, it becomes possible for each of the electrode parts obtained by dividing using slits to "generate bending deformation individually." As a result, the contact area between the action part and the fixed electrode via the dielectric film 12 can be made as large as possible and the capacitance value can be made as large as possible.

Sixth Embodiment

Figure 21:
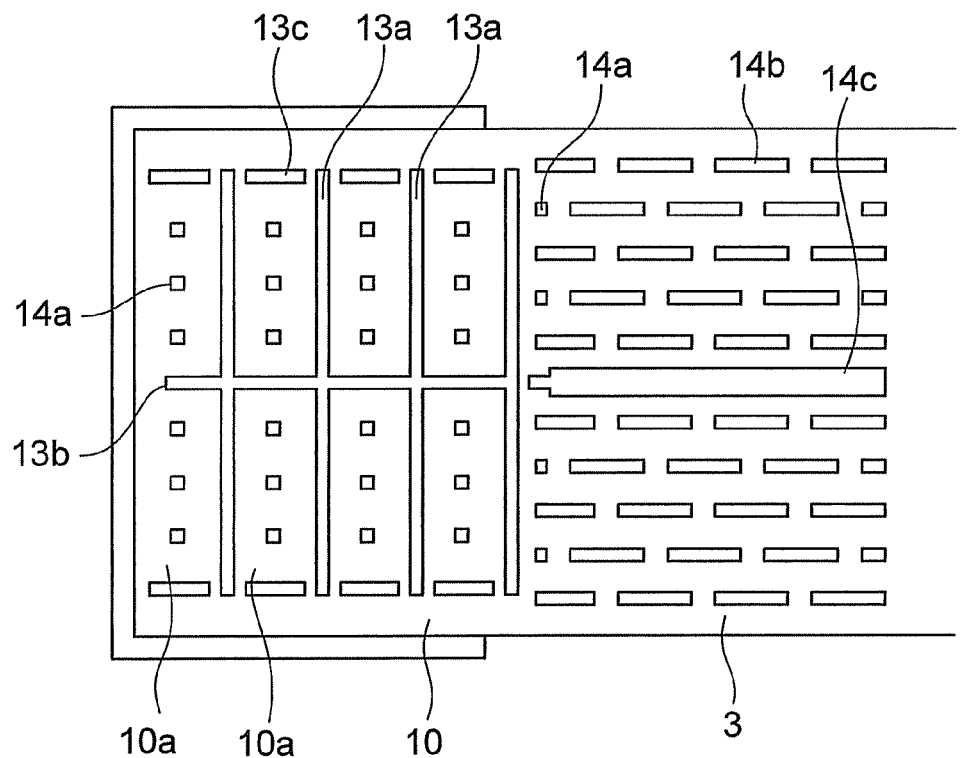
FIG. 21 is a plan view showing an action part in the MEMS apparatus in a sixth embodiment.

A plan view of an action part of a piezoelectric driven MEMS apparatus according to a sixth embodiment of the present invention is shown in FIG. 21. In the piezoelectric driven MEMS apparatus according to the present embodiment, the action part 10 is divided into eight electrode parts 10a by three-kind slits 13a, 13b and 13c. Four slits 13a are provided in parallel in a direction perpendicular to the direction of extension of the movable beam 3. A slit 13b is provided in the center of the action part 10 in the direction of extension of the movable beam 3. Slits 13c are provided in a stitch form on both sides of the action part 10 in the direction of extension of the movable beam 3. Only at least a part of a perimeter of each electrode part 10a is connected to adjacent electrode parts via a connection part. A ratio occupied by the connection part in the perimeter length of each electrode part is 25% at maximum. Therefore, it becomes possible for each electrode part to "generate bending deformation individually."

Furthermore, a plurality of holes 14a are also provided through the movable beam 3 which supports the action part 10. In addition, a plurality of short and thin slits 14b are provided through the movable beam 3 in the direction of its extension, and a thick and long slit 14c is provided in the center of the movable beam 3 in the direction of its extension. When fabricating the MEMS apparatus, the holes 14a and the slits 14b and 14c can be used as drawing holes for removing the sacrifice layer.

In the present embodiment as well, it becomes possible for each of the electrode parts obtained by dividing using slits to "generate bending deformation individually." As a result, the contact area between the action part and the fixed electrode via the dielectric film 12 can be made as large as possible and the capacitance value can be made as large as possible.

Seventh Embodiment

Figure 22:
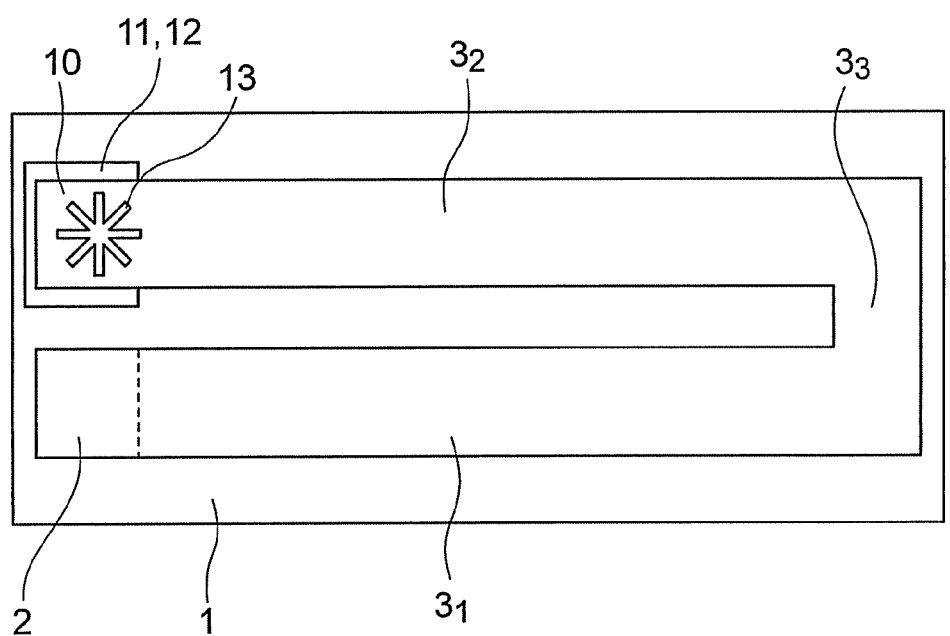
FIG. 22 is a plan view showing an action part in the MEMS apparatus in a seventh embodiment.

A plan view of a piezoelectric driven MEMS apparatus according to a seventh embodiment of the present invention is shown in FIG. 22. The piezoelectric driven MEMS apparatus according to the present embodiment is a variable capacitor, and includes a movable beam $3_1$, $3_2$ and $3_3$ having a simple folded structure. The first movable beam $3_1$ is fixed at its first end to an anchor 2 provided on a substrate. A first end of the second movable beam $3_2$ becomes an action end and serves as an action part. A second end of the first movable beam $3_1$ and a second end of the second movable beam $3_2$ are connected by the third movable beam $3_3$. In other words, the third movable beam $3_3$ serves as a connection part which connects the first movable beam $3_1$ and the second movable beam $3_2$. In the same way as the movable beam 3 in the first embodiment, each of the first to third movable beams $3_1$, $3_2$ and $3_3$ has a laminated structure of a lower electrode, a piezoelectric film and an upper electrode serving also as a support film.

In the present embodiment, slits 13 which extend radially from the center of the action part 10 are provided in the action part 10 which becomes the action end of the second movable beam $3_2$ in the same way as the second embodiment. Therefore, the action part 10 is divided into a plurality of electrode parts by the slits 13. Furthermore, a fixed electrode 11 is provided on a substrate 1 so as to be opposed to the action part 10. The fixed electrode 11 is covered by a dielectric film 12 in the same way as the first embodiment.

In the present embodiment as well, therefore, the contact area between the action part and the fixed electrode via the dielectric film 12 can be made as large as possible and the capacitance value can be made as large as possible, in the same way as the second embodiment.

In the seventh embodiment, the actuator has the simple folded structure. Alternatively, a folded structure obtained by inverting the polarity in the lengthwise direction of the beam, arranging at least three beams in parallel and connecting them by using a connection part may be used. In the case of these folded structures, it is possible to increase the bending factor and decrease the bending stress applied to the head part.

In the present embodiment, the slits provided in the action part 10 are the same slits as those in the second embodiment. However, the same effects can be brought about even if the slits provided in the action part 10 are the same slits as those in any of the first embodiment, the third embodiment, the fourth embodiment, the modification of the fourth embodiment, the fifth embodiment and the sixth embodiment.

Eighth Embodiment

Figure 23:
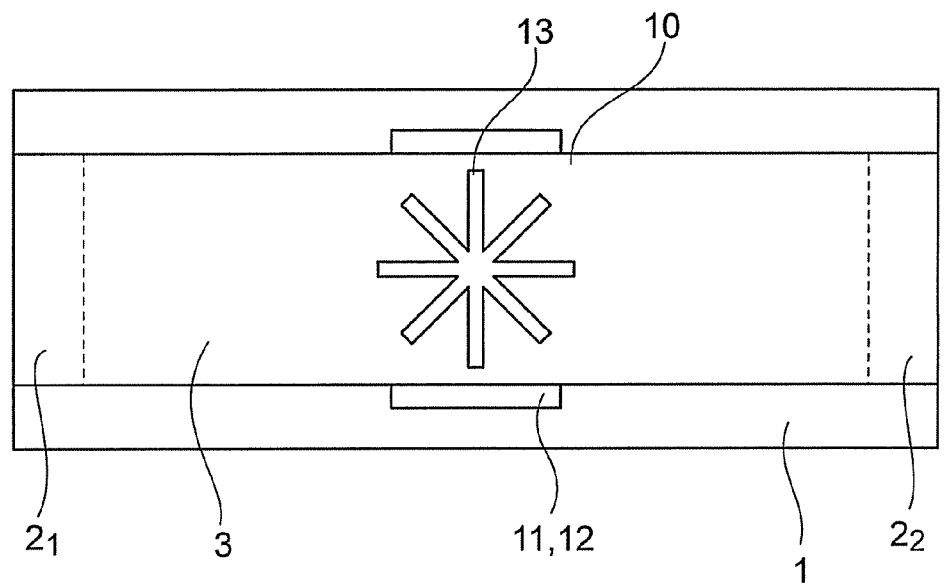
FIG. 23 is a plan view showing a MEMS apparatus in an eighth embodiment.

A plan view of a piezoelectric driven MEMS apparatus according to an eighth embodiment of the present invention is shown in FIG. 23. The piezoelectric driven MEMS apparatus according to the present embodiment is a variable capacitor. Ends of the movable beam 3 are fixed to the substrate 1 via anchors 21 and 22. A central part of the movable beam 3 serves as the action part 10.

The movable beam 3 has the same structure as that of the movable beam according to the first embodiment, i.e., the laminated structure of lower electrode/piezoelectric film/upper electrode. In the same way as the second embodiment, slits 13 extending radially from the center of the action part 10 are provided in the action part 10. As a result, the action part 10 is divided into a plurality of electrode parts by the slits 13. Furthermore, the fixed electrode 11 is provided on the substrate 1 so as to be opposed to the action part 10. The fixed electrode 11 is covered by the dielectric film 12 in the same way as the first embodiment.

In the present embodiment as well, therefore, the contact area between the action part and the fixed electrode via the dielectric film 12 can be made as large as possible and the capacitance value can be made as large as possible, in the same way as the second embodiment.

In the present embodiment, the slits provided in the action part 10 are the same slits as those in the second embodiment. However, the same effects can be brought about even if the slits provided in the action part 10 are the same slits as those in any of the first embodiment, the third embodiment, the fourth embodiment, the modification of the fourth embodiment, the fifth embodiment and the sixth embodiment.

In the first to eighth embodiments, it is desirable that each electrode part has a singly-supported beam structure supported from one direction or a beam structure supported from at least two directions in order to make it possible to "generate bending deformation individually."

In the first to eighth embodiments, the MEMS apparatus is a variable capacitor. If the resistance of the dielectric film 12 is made small by forming the dielectric film 12 covering the fixed electrode 11 very thinly or the dielectric film 12 is not formed, the MEMS apparatus can be used as an RF switch. In this case, a capacitive type RF switch having a large on-off ratio is obtained.

In the first to eighth embodiments, a voltage applying part which applies a voltage between the lower electrode and the fixed electrode in the action part may be further provided in order to cause electrostatic force to act between the lower electrode and the fixed electrode in the action part. Drive using the electrostatic force as well simultaneously is conducted, resulting in hybrid drive. In this case, force is exercised to further cause each electrode part to stick to the fixed electrode, resulting in a desirable MEMS apparatus.

In the first to eighth embodiments, the upper electrode serves as the support film as well. Alternatively, the upper electrode and the support film may be provided separately. In this case, the actuator has a laminated structure of lower electrode/piezoelectric film/upper electrode/support film.

In the first to eighth embodiments, the actuator has a unimorph structure obtained by laminating lower electrode/piezoelectric film/upper electrode. Alternatively, a bimorph structure obtained by laminating lower electrode/piezoelectric film/intermediate electrode/piezoelectric film/upper electrode in the cited order may be used.

As for the piezoelectric substance, wurtzite crystal such as aluminum nitride (AlN) or zinc oxide (ZnO) is stable and desirable. Perovskite ferroelectrics such as lead titanate zirconate (PZT) or barium titanate (BTO) may also be used.

As for the electrode material of the movable beam and the fixed electrode, a low resistance metal such as aluminum (Al), gold (Au), platinum (Pt), copper (Cu), iridium (Ir), tungsten (W) or molybdenum (Mo) is desirable from the viewpoint of the resistivity value and easiness in thin film forming.

Ninth Embodiment

Figure 24:
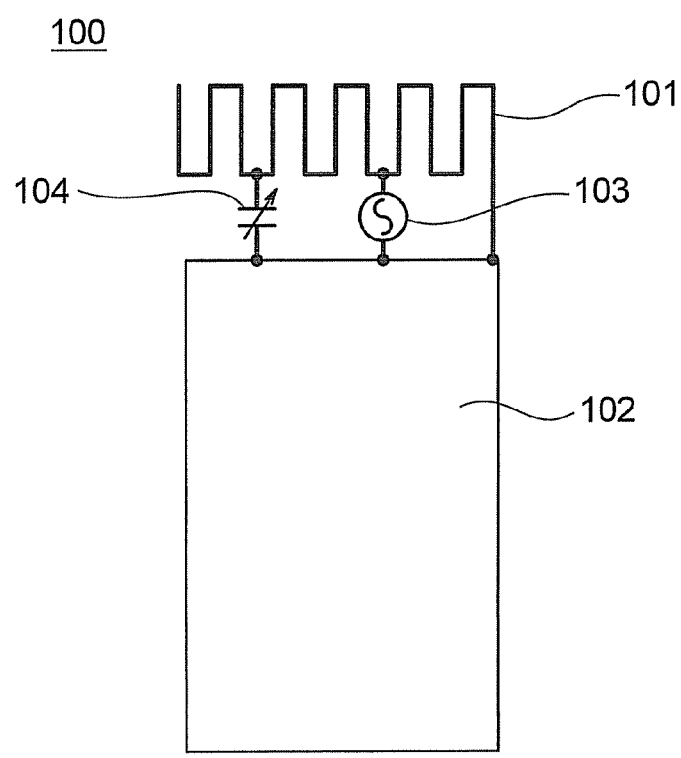
FIG. 24 is a schematic diagram showing a tunable antenna according to a ninth embodiment.

A portable terminal according to a ninth embodiment of the present invention will now be described with reference to FIG. 24. FIG. 24 is a schematic diagram of a tunable antenna 100 used in the portable terminal according to the present embodiment. The tunable antenna 100 is called reverse F type. The tunable antenna 100 includes an antenna element 101 formed in a meander form and a printed circuit board (PCB) 102. The printed circuit board 102 serves as a radiation element as well.

A radio frequency circuit is connected to a feed point 103 which is connected to the antenna element 101 and the printed circuit board 102. Transmission and reception signals are applied to the feed point 103. A variable capacitor 104 according to any one of the first to seventh embodiments is connected between the antenna element 101 and the printed circuit board 102. Dimensions of the antenna element 101 are 50 mm in the lateral direction and 30 mm in the lengthwise direction. Dimensions of the printed circuit board 102 are 50 mm in the lateral direction and 90 mm in the lengthwise direction. The variable capacitor 104 has a capacitance 0.056 pF at a drive voltage of −3 V, a capacitance 0.350 pF at a drive voltage of 1.5 V, and a capacitance 0.860 pF at a drive voltage of 3 V. Thus, the variable capacitor 104 has very large variable capacitance characteristics.

The efficiency of the tunable antenna 100 according to the present embodiment is measured in a radio wave shield room. As a result, a frequency range where the efficiency is at least −3 dB is 390 MHz to 490 MHz when 3 V is applied, 480 MHz to 660 MHz when 1.5 V is applied, and 610 MHz to 780 MHz when −3 V is applied. It is confirmed that the tunable antenna 100 according to the present embodiment has a very wide variable frequency range.

In the present embodiment, a tunable antenna has the variable capacitor according to any one of the first to eighth embodiments. Since the variable capacitor according to any one of the first to eighth embodiments can provide a large variable capacitance ratio in low-voltage operation, however, the variable capacitor can be applied not only to the tunable antenna but also to radio frequency components in a mobile radio terminal such as the portable telephone suitably. For example, the variable capacitor can be applied to a local oscillator having a large Q and a wide variable frequency range and a variable impedance matching circuit having a wide frequency range.

According to the embodiments of the present invention, the maximum capacitance value of the variable capacitor remarkably increases by using the MEMS variable capacitor structure as heretofore described in detail. It thus becomes possible to provide a variable capacitor having a large variable capacitance ratio and a capacitive RF switch having a large on-off ratio.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A piezoelectric driven MEMS apparatus comprising:
a substrate;
a support part provided on the substrate;
a fixed electrode provided on the substrate; and
an actuator having a first electrode film, a piezoelectric film formed on the first electrode film, and a second electrode film formed on the piezoelectric film, a first end of the actuator being supported by the support part, a second end of the actuator being disposed so as to be opposed to the fixed electrode, the second end of the actuator being divided into a plurality of electrode parts by a plurality of slits which pass through the first electrode film, the piezoelectric film and the second electrode film, at least a part of each electrode part being linked to parts of adjacent electrode parts, and each electrode part being capable of generating bending deformation individually.

2. The apparatus according to claim 1, wherein each of the slits comprises:
one set of first rectilinear slit parts formed in a direction of extension of the actuator; and
a second slit part which takes a semicircular shape and which is connected at an end to the first slit parts.

3. The apparatus according to claim 1, wherein each of the slits is a slit which extends radially from substantially a center of the second end of the actuator.

4. The apparatus according to claim 1, wherein each of the slits is a rectilinear slit which extends toward the second end of the actuator in a direction of extension of the actuator.

5. The apparatus according to claim 1, wherein the slits comprise cross-shaped slits.

6. The apparatus according to claim 1, wherein the slits comprise C-shaped slits.

7. The apparatus according to claim 1, wherein a part of at least 500% of a perimeter length of the electrode part is formed as a free end face.

8. The apparatus according to claim 1, further comprising an electrostatic force applying part which applies a voltage between the first electrode film and the fixed electrode and causes electrostatic force to act.

9. The apparatus according to claim 1, wherein the actuator is a movable beam having a folded structure.

10. The apparatus according to claim 1, wherein the actuator has a bimorph structure.

11. A piezoelectric driven MEMS apparatus comprising:
a substrate;
a first support part provided on the substrate;
a second support part provided on the substrate;
an actuator having a first electrode film, a piezoelectric film formed on the first electrode film, and a second electrode film formed on the piezoelectric film, a first end of the actuator being supported by the first support part, a second end of the actuator being supported by the second support part, a central part of the actuator being divided into a plurality of electrode parts by a plurality of slits which pass through the first electrode film, the piezoelectric film and the second electrode film, at least a part of each electrode part being linked to parts of adjacent electrode parts, and each electrode part being capable generating bending deformation individually; and a fixed electrode provided on the substrate so as to be opposed to the first electrode film in the central part.

12. The apparatus according to claim 11, wherein each of the slits is a slit which extends radially from substantially a center of the central part.

13. The apparatus according to claim 11, wherein the slits comprise cross-shaped slits.

14. The apparatus according to claim 11, wherein the slits comprise C-shaped slits.

15. The apparatus according to claim 11, wherein a part of at least 50% of a perimeter length of the electrode part is formed as a free end face.

16. The apparatus according to claim 11, further comprising an electrostatic force applying part which applies a voltage between the first electrode film and the fixed electrode and causes electrostatic force to act.

17. The apparatus according to claim 11, wherein the actuator is a movable beam having a folded structure.

18. The apparatus according to claim 11, wherein the actuator has a bimorph structure.

19. A portable terminal comprising the piezoelectric driven MEMS apparatus according to claim 1 as at least one of a variable capacitor and an RF switch.

20. A portable terminal comprising the piezoelectric driven MEMS apparatus according to claim 11 as at least one of a variable capacitor and an RF switch.

* * * * *